US006329474B1

(12) United States Patent
Arata et al.

(10) Patent No.: US 6,329,474 B1
(45) Date of Patent: Dec. 11, 2001

(54) EPOXIDIZED PHENOL-HYDROXYBENZALDEHYDE CONDENSATE, BISPHENOL-FORMALDEHYDE CONDENSATE AND MASKED IMIDAZOLE

(75) Inventors: Michitoshi Arata; Shigeo Sase, both of Shimodate; Nozomu Takano, Yuki; Tomio Fukuda, Shimodate, all of (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 0 days.

(21) Appl. No.: 09/541,515

(22) Filed: Apr. 3, 2000

Related U.S. Application Data

(63) Continuation of application No. 08/973,219, filed as application No. PCT/JP96/01707 on Jun. 20, 1996, now abandoned.

(30) Foreign Application Priority Data

Jun. 27, 1995 (JP) .................................................. 7-160671

(51) Int. Cl.[7] .............................. E32B 27/04; C08L 61/10; C08L 61/12; C08L 63/04; C09J 163/04
(52) U.S. Cl. ......................... 525/485; 156/330; 428/365; 525/489
(58) Field of Search .................................... 525/485, 489; 428/365; 156/330

(56) References Cited

U.S. PATENT DOCUMENTS

| | | | |
|---|---|---|---|
| 4,390,664 | 6/1983 | Kanayama | 525/117 |
| 5,008,350 | 4/1991 | Saito et al. | 525/507 |
| 5,346,743 | 9/1994 | Uchida et al. | 428/76 |
| 5,661,223 | 8/1997 | Oka et al. | 525/481 |

FOREIGN PATENT DOCUMENTS

| | | |
|---|---|---|
| 0394965 | 4/1990 | (EP) . |
| 0522333 | 1/1993 | (EP) . |
| 0558149 | 9/1993 | (EP) . |
| 57-141419 | 9/1982 | (JP) . |
| 2-73818 | 3/1990 | (JP) . |
| 2-245016 | 9/1990 | (JP) . |
| 3-79621 | 4/1991 | (JP) . |
| 3-124735 | 5/1991 | (JP) . |
| 4-338691 | 11/1992 | (JP) . |

OTHER PUBLICATIONS

Patent Abstracts of Japan, vol. 014, No. 566, Dec. 17, 1990 (No. JP 02245016A, Sep. 1990).
Database WPI Week 9240, Derwent Publications Ltd., AN 92–328241 (No. JP 04236216A, Aug. 1992).
Database WPI Week 8810, Derwent Publications Ltd., AN 88–068037 (No. JP 63022824A, Sep. 1987).
Patent Abstracts of Japan, vol. 018, No. 022, Jan. 13, 1994 (No. JP 05259315, Oct. 1993).
Database WPI Week 8916, Derwent Publications Ltd., AN 89–119504 (No. JP 01066225A, Mar. 1989).

*Primary Examiner*—Robert E. L. Sellers
(74) *Attorney, Agent, or Firm*—Antonelli, Terry, Stout & Kraus, LLP

(57) ABSTRACT

An epoxy resin composition for printed wiring boards which comprises as the essential components (a) an epoxy resin obtained by epoxidizing a condensation product of a phenol with hydroxybenzaldehyde, (b) a condensation product of bisphenol A with formaldehyde, (c) a flame retardant, and (d) a curing accelerator, and a laminate for printed wiring boards which has a low hygroscopicity, a high heat resistance, good high-temperature characteristics, a high resistance against electrolytic corrosion, a high resistance against color change due to heating, and a high Tg.

18 Claims, No Drawings

EPOXIDIZED PHENOL-HYDROXYBENZALDEHYDE CONDENSATE, BISPHENOL-FORMALDEHYDE CONDENSATE AND MASKED IMIDAZOLE

This application is a Continuation application of Ser. No. 08/973,219, filed Dec. 4, 1997, abandoned, which is an application under 35 USC 371 of International Application No. PCT/JP96/01707, filed Jun. 20, 1996.

TECHNICAL FIELD

The present invention relates to epoxy resin compositions for printed wiring boards useful for the production of printed wiring boards, and to laminates for printed wiring boards produced with the use of the epoxy resin compositions.

BACKGROUND ART

As electronic instruments have been miniaturized and improved in performance, the density of printed wiring boards used therein has increased due to high multilayering, thinning and decreases in through-hole diameter and in the distance between the through-holes. Printed wiring boards are also used in recent semiconductor packages of plastic pin grid array or plastic ball grid array wherein semiconductor tips are mounted directly on printed wiring boards and sealed with resins. In the course of the production of such semiconductor packages, printed wiring boards experience high temperatures of 175° C. or higher during wire bonding or resin sealing. So printed wiring boards of low strength and low elastic modulus may cause disconnection of bonding wires or bow or twist after resin sealing. To improve the high temperature characteristics at 175° C. or higher, including strength and elastic modulus, printed wiring boards should have a higher Tg (glass transition temperature). Printed wiring boards for semiconductor packages have growing requirement for higher wiring density, and insulation reliability is an important property.

To meet these requirements, development work on new materials for printed wiring boards is proceeding. As disclosed in Japanese Patent Application Unexamined Publication No. 60-155453, as a means for increasing Tg, curing of polyfunctional epoxy resins with dicyandiamide is studied extensively. Unfortunately the epoxy resins cured with dicyandiamide have a high hygroscopicity and hardly satisfy the high insulation reliability necessary for the future printed wiring boards with higher density. Among various insulation troubles, metal migration (electrolytic corrosion) has been found to be a serious trouble. Metal migration is the phenomenon that the metal constructing wiring, circuit pattern or electrodes on or inside insulation materials migrates on or inside the insulation materials by the development of potential difference under the circumstances of high humidity.

To the contrary, printed wiring boards produced by using polyfunctional phenols as curing agents have a low hygroscopicity and a good resistance against electrolytic corrosion. Some polyfunctional phenols, however, discolor the printed wiring boards during heating processes. To prevent the color change due to heating, in Japanese Patent Application Examined Publication No. 62-28168 is proposed a curing agent which contains a high-ortho phenol-formaldehyde resin derived mainly from phenol or bisphenol A. Even this curing agent cannot provide printed wiring boards having a high Tg enough to tolerate high temperatures of 175° C. or higher.

In the circumstances, an object of the present invention is to provide epoxy resin compositions which are useful for the production of printed wiring boards having a low hygroscopicity, a high heat resistance, good high-temperature characteristics, a high resistance against electrolytic corrosion, a high resistance against color change due to heating and a high Tg.

Another object of the present invention is to provide laminates for printed wiring boards, which are produced by using the epoxy resin compositions and have a high heat resistance, good high-temperature characteristics, a high resistance against electrolytic corrosion, a high resistance against color change due to heating and a high Tg.

DISCLOSURE OF INVENTION

The present invention provides an epoxy resin composition for a printed wiring board, comprising (a) an epoxy resin obtained by epoxidizing a condensation product of a phenol with a hydroxybenzaldehyde, (b) a condensation product of bisphenol A with formaldehyde, (c) at least one flame retardant selected from the group consisting of a halogenated bisphenol A epoxy resin, a halogenated bisphenol F epoxy resin, a halogenated bisphenol S epoxy resin, a halogenated phenol novolac epoxy resin, a halogenated cresol novolac epoxy resin, a halogenated bisphenol A novolac epoxy resin, a halogenated bisphenol F novolac epoxy resin, a halogenated alicyclic epoxy resin, a halogenated aliphatic linear epoxy resin, a halogenation product of a glycidyl ester epoxy resin, a halogenation product of a glycidylamine epoxy resin, a halogenation product of a hydantoin epoxy resin, a halogenation product of an isocyanurate epoxy resin, a glycidyl ether of a halogenated dihydric phenol, a glycidyl ether of a halogenated dihydric alcohol, a halogenated bisphenol A, a halogenated bisphenol F, a halogenation product of a polyvinylphenol, a halogenated phenol novolac resin, a halogenated cresol novolac resin, a halogenated alkylphenol novolac resin, a halogenated catechol novolac resin and a halogenated bisphenol F novolac resin, and (d) a curing accelerator comprising at least one imidazole compound.

The present invention further provides a laminate for a printed wiring board produced by impregnating a base material with a resin varnish containing the above epoxy resin composition for printed wiring boards and drying to form prepreg, superposing at least two sheets of the prepreg on each other, with a metal foil superposed on one or both sides of the superposed composite, and heating and pressing the superposed composite.

BEST MODE FOR CARRYING OUT THE INVENTION

Hereinafter the present invention will be described in detail.

The epoxy resin (a) is obtained by epoxidizing a condensation product of a phenol with a hydroxybenzaldehyde. Typical phenols which are suitable for use in the present invention include phenol, cresol and other monohydric phenols having one or more alkyl groups, such as propyl or tert-butyl, with phenol particularly preferred. Typical hydroxybenzaldehydes which are suitable for use in the present invention include salicylaldehyde, m-hydroxybenzaldehyde, p-hydroxybenzaldehyde, vanillin, syringaaldehyde, β-resorcylaldehyde and protocatechualdehyde, with salicylaldehyde particularly preferred.

The condensation of phenols with hydroxybenzaldehydes may be carried out by any non-limitative methods, desirably by allowing 1 mole of a phenol to react with 0.1 to 3.0 moles, preferably 0.3 to 1.5 moles of a hydroxybenzaldehyde, in the presence of an acid catalyst.

The condensation product is epoxidized with an epoxidizing agent, such as epichlorohydrin, to give the epoxy resin (a).

There is no particular limitation in the kinds of phenols, hydroxybenzaldehydes and epoxidizing agents which are to be used as the raw materials of the epoxy resin (a) nor in the methods of condensation and epoxidation. Preferred epoxy resins are produced by allowing 1 mole of phenol with 0.1 to 3.0 moles of salicylaldehyde in the presence of an acid catalyst, such as hydrochloric acid, at 80 to 250° C. for 1 to 6 hours, and allowing at least 3 equivalent of epichlorohydrin to react with 1 equivalent of the hydroxyl groups of the condensation product, and have a weight average molecular weight of 700 to 5,000, a softening temperature of 40 to 140° C. and an epoxy group equivalent weight of 130 to 280.

According to the present invention, the epoxy resins (a) may be used together with other epoxy resins; for example, bisphenol A epoxy resins, bisphenol F epoxy resins, bisphenol S epoxy resins, biphenol epoxy resins, phenol novolac epoxy resins, cresol novolac epoxy resins, bisphenol A novolac epoxy resins, bisphenol F novolac epoxy resins, alicyclic epoxy resins, aliphatic linear epoxy resins, glycidyl ester epoxy resins, glycidyl amine epoxy resins, hydantoin epoxy resins, isocyanurate epoxy resins, glycidyl ethers of dihydric phenols, glycidyl ethers of dihydric alcohols and hydrogenation products thereof. These epoxy resins may be used individually or as a mixture of two or more.

The amount of the epoxy resins other than the epoxy resins (a) is preferably 0 to 200 parts by weight, more preferably 10 to 100 parts by weight, per 100 parts by weight of the epoxy resins (a).

The molecular weight of the condensation product (b) of bisphenol A with formaldehyde is not particularly limited, and is preferably 250 to 20,000 in weight average molecular weight. The condensation product may contain bisphenol A monomer. The condensation is preferably carried out by allowing 1 mole of bisphenol A to react with 0.1 to 6.0 moles of formaldehyde in the presence of an acid catalyst at 80 to 250° C.

Preferred condensation products of bisphenol A with formaldehyde include bisphenol A novolac resins having a hydroxyl group equivalent weight of 100 to 130.

The condensation product of bisphenol A with formaldehyde is added as a curing agent in such an amount as to provide preferably 0.5 to 1.5 equivalents, more preferably 0.9 to 1.1 equivalents of the phenolic hydroxyl groups of the condensation product (b) per equivalent of the epoxy groups of the epoxy resin (a).

The condensation product of bisphenol A with formaldehyde may be used together with other curing agents, such as bisphenol F, polyvinylphenols, or novolac resins derived from phenol, cresol, alkylphenols, catechol or bisphenol F. The molecular weights of these compounds are not particularly limited, and these compounds may be added individually or in combination of two or more. The amount of these compounds is preferably 0 to 100 parts by weight per 100 parts by weight of the condensation product (b) of bisphenol A with formaldehyde.

The flame retardant (c) may be any one which is generally called a flame retardant, and typical flame retardants useful in the present invention include halogenated products of bisphenol A epoxy resins, bisphenol F epoxy resins, bisphenol S epoxy resins, phenol novolac epoxy resins, cresol novolac epoxy resins, bisphenol A novolac epoxy resins, bisphenol F novolac epoxy resins, alicyclic epoxy resins, aliphatic linear epoxy resins, glycidyl ester epoxy resins, glycidylamine epoxy resins, hydantoin epoxy resins, isocyanurate epoxy resins, glycidyl ethers of dihydric phenols or glycidyl ethers of dihydric alcohols; halogenated products of bisphenol A, bisphenol F, polyvinylphenols or novolac resins derived from phenol, cresol, alkylphenols, catechol or bisphenol F; antimony trioxide, and triphenyl phosphate. Particularly preferred are tetrabromobisphenol A, glycidyl ether of tetrabromobisphenol A, and brominated products of glycidyl ethers of condensation products of phenol with formaldehyde.

The amount of the flame retardants (c) is preferably 20 to 500 parts by weight, more preferably 30 to 200 parts by weight, per 100 parts by weight of the epoxy resins (a).

The curing accelerator (d) to be used in the present invention comprises at least one imidazole compound. Particularly, imidazoles having an imino group masked with acrylonitrile, isocyanate or melamine acrylate give prepreg which is at least twice as stable during storage as conventional prepreg.

Imidazole compounds useful in the present invention include not only the compounds having an imidazole ring but also the compounds having an imidazoline ring, and typical examples include imidazole, 2-ethylimidazole, 2-ethyl-4-methylimidazole, 2-phenylimidazole, 2-undecylimidazole, 1-benzyl-2-methylimidazole, 2-heptadecylimidazole, 4,5-diphenylimidazole, 2-methylimidazoline, 2-phenylimidazoline, 2-undecylimidazoline, 2-heptadecylimidazoline, 2-isopropylimidazole, 2,4-dimethylimidazole, 2-phenyl-4-methylimidazole, 2-ethylimidazoline, 2-isopropylimidazoline, 2,4-dimethylimidazoline and 2-phenyl-4-methylimidazoline. Typical agents which are useful for masking imino groups include acrylonitrile, phenylene diisocyanate, toluidine isocyanate, naphthalene diisocyanate, methylene-bis-phenyl isocyanate and melamine acrylate.

Among the above various imidazole compounds, particularly preferred imidazole compounds having a masked imino group are 1-cyanoethyl-2-ethyl-4-methylimidazole and isocyanate-masked imidazole.

These curing accelerators may be used individually or in combination of two or more, preferably in an amount of 0.01 to 5 parts by weight, more preferably 0.05 to 2 parts by weight, per 100 parts by weight of epoxy resins. If the amount of the curing accelerators is less than 0.01 part by weight, curing cannot be accelerated effectively, and if more than 5 parts by weight, the epoxy resin composition will lose storage stability.

The epoxy resin compositions of the present invention may be used in various forms, and when used for impregnating base materials, they are usually dissolved in a solvent. Typical examples of solvents include acetone, methyl ethyl ketone, toluene, xylene, methyl isobutyl ketone, ethyl acetate, ethylene glycol monomethyl ether, N,N-dimethylacetamide, methanol and ethanol, which may be used individually or in combination of two or more.

The epoxy resin compositions of the present invention may contain one or more inorganic fillers selected, for example, from powders of crystalline silica, fused silica, alumina, zirconium, calcium silicate, calcium carbonate, silicon carbide, silicon nitride, boron nitride, beryllia, magnesia, zirconia, forsterite, stearite, spinel, mullite and titania, single crystal fibers of potassium titanate, silicon carbide, silicon nitride and alumina, and glass fibers.

The amount of the inorganic fibers is preferably not more than 650 parts by weight, more preferably not more than 200 parts by weight, per 100 parts by weight of 100 parts by weight of the total of (a), (b) and (c). When contained in the epoxy resin compositions, they are preferably 2 to 650 parts by weight.

The above components are mixed to form a varnish, and a base material, such as glass fabric, glass non-woven fabric, paper or other fabric, is impregnated with the varnish, and then dried in a drying furnace at 80 to 200° C., to give prepreg for printed wiring boards. A desired number of sheets of the prepreg are superposed on each other, with a metal foil superposed on one or both sides of the superposed composite, which is then heated and pressed at 150 to 190° C. at a pressure of 20 to 80 kgf/cm$^2$ to form a laminate for printed wiring boards.

Multilayer printed wiring boards can also be produced by bonding two or more printed wiring boards by using the prepreg.

In the production of prepreg, the drying means the removal of solvents, if any, or making the epoxy resin compositions non-flowable at room temperature when no solvent is used.

According to the present invention, the specific combination of the epoxy resin which is obtained by epoxidizing a condensation product of a phenol with a hydroxybenzaldehyde, the condensation product of bisphenol A with formaldehyde, the specific flame retardant and the specific curing accelerator gives epoxy resin compositions which can be cured to a high cross-linking density due to the improved reactivity of glycidyl ether groups with phenolic hydroxyl groups compared with the conventional epoxy resin compositions, and provides printed wiring boards having a low hygroscopicity, high heat resistance, good high-temperature characteristics, a high resistance against electrolytic corrosion, a high resistance against color change due to heating and a high Tg.

EXAMPLES

Hereinafter the present invention will be described in detail referring to working examples, which, however, do not limit the scope of the present invention.

Example 1

100 parts by weight of a phenol-salicylaldehyde novolac epoxy resin (epoxy group equivalent weight: 170), 46 parts by weight of a bisphenol A novolac resin (hydroxyl group equivalent weight: 114) and 51 parts by weight of tetrabromobisphenol A (bromine content: 58% by weight, hydroxyl group equivalent weight: 272) were dissolved in methyl ethyl ketone. 0.3 parts by weight of 1-cyanoethyl-2-ethyl-4-methylimidazole was added as a curing accelerator, to form a varnish containing 65% by weight of non-volatile matters.

Example 2

54 parts by weight of the same phenol-salicylaldehyde novolac epoxy resin as above, 46 parts by weight of a brominated bisphenol A epoxy resin (bromine content: 49% by weight, epoxy group equivalent weight: 400) and 50 parts by weight of the same bisphenol A novolac resin as above were dissolved in methyl ethyl ketone. 0.3 parts by weight of 1-cyanoethyl-2-ethyl-4-methylimidazole was added as a curing accelerator, to form a varnish containing 65% by weight of non-volatile matters.

Example 3

36 parts by weight of the same phenol-salicylaldehyde novolac epoxy resin as above, 64 parts by weight of brominated phenol novolac epoxy resin (bromine content: 35.3% by weight, epoxy group equivalent weight: 284) and 50 parts by weight of the same bisphenol A novolac resin as above were dissolved in methyl ethyl ketone. 0.3 parts by weight of 1-cyanoethyl-2-ethyl-4-methylimidazole was added as a curing accelerator, to form a varnish containing 65% by weight of non-volatile matters.

Example 4

A varnish was prepared in the same manner as in Example 1 with the exception that 0.5 parts by weight of 2-ethyl-4-methylimidazole masked with hexamethylene diisocyanate was used in place of the 1-cyanoethyl-2-ethyl-4-methylimidazole.

Comparative Example 1

A varnish was prepared in the same manner as in Example 1 with the exception that 100 parts by weight of an o-cresol novolac epoxy resin (epoxy group equivalent weight: 195) was used in place of the phenol-salicylaldehyde novolac epoxy resin, and 38 parts by weight of the same bisphenol A novolac resin as above and 48 parts by weight of the same tetrabromobisphenol A as above were used.

Comparative Example 2

A varnish was prepared in the same manner as in Example 1 with the exception that 43 parts by weight of a phenol novolac resin (hydroxyl group equivalent weight: 106) was used in place of the bisphenol A novolac resin, and 50 parts by weight of the same tetrabromobisphenol A as above was used.

Comparative Example 3

To a mixture of 80 parts by weight of a lowly-brominated epoxy resin (bromine content: 21% by weight, epoxy group equivalent weight: 485) and 20 parts by weight of the same phenol-salicylaldehyde novolac resin as above was added 1 part by weight of dicyandiamide dissolved in ethylene glycol monomethyl ether. 0.2 parts by weight of 1-cyanoethyl-2-ethyl-4-methylimidazole was added as a curing accelerator, to form a varnish containing 65% by weight of non-volatile matters.

Comparative Example 4

A varnish was prepared in the same manner as in Comparative Example 3 with the exception that the same o-cresol novolac epoxy resin as above was used in place of the phenol-salicylaldehyde novolac epoxy resin.

The components and the amounts thereof used in the above Examples and Comparative Examples 1 to 4 are listed in Table 1. The units of the amounts listed in Table 1 are part by weight. A glass fabric of 0.2 mm thick was impregnated with each of the varnishes prepared in the above Examples and Comparative Examples 1 to 4, and then heated at 160° C. for 2 to 5 minutes to give prepreg. The storage stability of the obtained prepreg was evaluated by allowing it to stand at 25° C. at 50%RH for 60 days, and then determining the gel time of the prepreg. Also four sheets of the obtained prepreg were superposed, with a copper foil of 18 μm thick was superposed on each side of the superposed composite, which was then pressed at 175° C. for 90 minutes at 2.5 MPa, to form a both-sided copper-clad laminate. The both-sided copper-clad laminates thus obtained were tested for Tg, soldering heat resistance, water absorption, resistance against electrolytic corrosion, color change due to heating, and flexural strength and flexural modulus at room temperature and 200° C. The results are listed in Table 2 and Table 3. Further tests for non-flammability showed that these both-sided copper-clad laminates had a non-flammability corresponding to UL-94 VO.

TABLE 1

|  | Example Nos. | | | | Comparative Example Nos. | | | |
| --- | --- | --- | --- | --- | --- | --- | --- | --- |
|  | 1 | 2 | 3 | 4 | 1 | 2 | 3 | 4 |
| Phenol-salicylaldehyde novolac epoxy resin (epoxy group equivalent weight: 170) | 100 | 54 | 36 | 100 | — | 100 | 20 | — |
| Brominated bisphenol A epoxy resin (bromine content: 49 wt %, epoxy group equivalent weight: 400) | — | 46 | — | — | — | — | — | — |
| Lowly-brominated epoxy resin (bromine content: 21 wt %, epoxy group equivalent weight: 485) | — | — | — | — | — | — | 80 | 80 |
| Brominated phenol novolac epoxy resin (bromine content: 35.3 wt %, epoxy group equivalent weight: 284) | — | — | 64 | — | — | — | — | — |
| o-cresol novolac epoxy resin (epoxy group equivalent weight: 195) | — | — | — | — | 100 | — | — | 20 |
| Bisphenol A novolac resin (hydroxyl group equivalent weight: 114) | 46 | 50 | 50 | 46 | 38 | — | — | — |
| Tetrabromobisphenol A (bromine content: 58 wt %, hydroxyl group equivalent weight: 272) | 51 | — | — | 51 | 48 | 50 | — | — |
| Phenol novolac resin (hydroxyl group equivalent weight: 106) | — | — | — | — | — | 43 | — | — |
| Dicyandiamide | — | — | — | — | — | — | 1.0 | 1.0 |
| 1-cyanoethyl-2-ethyl-4-methylimidazole | 0.3 | 0.3 | 0.3 | — | 0.3 | 0.3 | 0.2 | 0.2 |
| isocyanate-masked imidazole | — | — | — | 0.5 | — | — | — | — |

TABLE 2

| Example Nos. | 1 | 2 | 3 | 4 |
| --- | --- | --- | --- | --- |
| Gel time of prepreg (sec) | | | | |
| Immediately after the production | 122 | 121 | 120 | 125 |
| After 60 days | 100 | 103 | 101 | 121 |
| Tg | 205 | 200 | 195 | 210 |
| Soldering heat resistance | OK | OK | OK | OK |
| Water absorption (wt %) | 0.56 | 0.45 | 0.48 | 0.59 |
| Days until the occurrence of continuity breakdown | >250 | >250 | >250 | >250 |
| Color change due to heating | ○ | ○ | ○ | ○ |
| Flexural strength | | | | |
| Room temperature | 620 | 638 | 660 | 600 |
| 200° C. | 82 | 84 | 78 | 86 |
| Flexural modulus | | | | |
| Room temperature | 22.6 | 23.1 | 23.3 | 22.5 |
| 200° C. | 13.3 | 13.1 | 13.1 | 13.4 |

TABLE 3

| Comparative Example Nos. | 1 | 2 | 3 | 4 |
| --- | --- | --- | --- | --- |
| Gel time of prepreg (sec) | | | | |
| Immediately after the production | 120 | 121 | 117 | 120 |
| After 60 days | 101 | 100 | 95 | 98 |
| Tg | 135 | 175 | 162 | 132 |
| Soldering heat resistance | NG | OK | NG | OK |
| Water absorption (wt %) | 0.55 | 0.58 | 1.12 | 1.05 |
| Days until the occurrence of continuity breakdown | 205 | 200 | 50 | 55 |
| Color change due to heating | ○ | X | Δ | Δ |
| Flexural strength | | | | |
| Room temperature | 618 | 633 | 621 | 642 |
| 200° C. | 32 | 57 | 35 | 25 |
| Flexural modulus | | | | |
| Room temperature | 22.8 | 23.1 | 22.7 | 23.5 |
| 200° C. | 10.4 | 12.4 | 10.2 | 9.5 |

The tests were carried out as follows.

Tg: After copper foils were etched away, Tg was determined by TMA (thermomechanical analysis). Unit: ° C.

Soldering heat resistance: After copper foils were etched away, the laminates were placed in a pressure cooker tester for 2 hours and then dipped in solder at 260° C. for 20 seconds. Then the appearance of the laminates was visually observed. In the Tables, NG means the occurrence of measling or blistering, and OK means the absence of measling or blistering.

Water absorption: After copper foils were etched away, the laminates were placed in a pressure cooker tester for 4 hours, and the water absorption of each laminate was determined from the difference between the weights before and after the pressure cooker test. Unit: % by weight Color change due to heating: After copper foils were etched away, the laminates were heated at 160° C. for 5 hours in air, and then visually observed for color change. Those with no color change rated as ○, those with some color change as Δ, and those with considerable color change as X.

Resistance against electrolytic corrosion: Each both-sided copper-clad laminate was processed into a test pattern having through holes with a wall-to-wall distance of 350 μm, and then the insulation resistance between 400 through holes were measured continuously. The test was carried out by applying 100 V in an atmosphere of 85° C. and 90%RH, and the time until the occurrence of continuity breakdown was determined.

Bending tests: Flexural strength and flexural modulus were determined according to JIS C 6481 at room temperature and 200° C. Units: flexural strength (GPa), flexural modulus (MPa).

The results show the following matters.

The both-sided copper-clad laminates of Examples 1 to 4, wherein a phenol-salicylaldehyde novolac epoxy resin was used as an epoxy resin, had a high Tg of 195° C. or higher and were excellent in soldering heat resistance and resistance against electrolytic corrosion. They also exhibited lesser decreases from the flexural strength and flexural modulus at room temperature to those at 200° C. The prepreg of Example 4 produced by using an isocyanate-masked imidazole as a curing accelerator had good storage stability.

The both-sided copper-clad laminates of Examples 1 to 4 and Comparative Example 1, wherein a bisphenol A novolac resin was used, had a good resistance against color change due to heating.

To the contrary, those of Comparative Example 1, wherein an o-cresol novolac epoxy resin was used as an epoxy resin, and Comparative Example 2, wherein a phenol novolac resin was used in place of a bisphenol A novolac resin, had a low Tg, and their flexural strength and flexural modulus at 200° C. were low. That of Comparative Example 2, wherein a phenol novolac resin was used as a curing agent, was inferior in the resistance against color change due to heating, and those of Comparative Examples 3 and 4 wherein dicyandiamide was used had high water absorption and were inferior in the resistance against electrolytic corrosion.

INDUSTRIAL APPLICABILITY

When used for the production of printed wiring boards, the epoxy resin compositions for printed wiring boards of the present invention give printed wiring boards having a low hygroscopicity, a high heat resistance, good high-temperature characteristics, a high resistance against electrolytic corrosion, a high resistance against color change due to heating and a high Tg.

What is claimed is:

1. An epoxy resin composition for a printed wiring board, comprising (a) an epoxy resin obtained by epoxidizing a condensation product of a phenol with a hydroxybenzaldehyde, (b) a condensation product of bisphenol A with formaldehyde, (c) at least one flame retardant, and (d) a curing accelerator which is an imidazole having an imino group masked with acrylonitrile, an isocyanate or melamine acrylate, wherein the composition contains 0.01 to 5 parts by weight of the curing accelerator (d) per 100 parts by weight of the epoxy resin (a).

2. The epoxy resin composition for a printed wiring board of claim 1, wherein the curing accelerator is an imidazole having an imino group masked with acrylonitrile or an isocyanate.

3. The epoxy resin composition for a printed wiring board of claim 1, wherein the masking agent for masking the imino group of the curing accelerator is selected from the group consisting of acrylonitrile, phenylene diisocyanate, toluidine isocyanate, naphthalene diisocyanate, methylene-bis-phenyl isocyanate and melamine acrylate.

4. The epoxy resin composition for a printed wiring board of claim 1, wherein the at least one flame retardant is selected from the group consisting of a halogenated bisphenol A epoxy resin, a halogenated bisphenol F epoxy resin, a halogenated bisphenol S epoxy resin, a halogenated phenol novolac epoxy resin, a halogenated cresol novolac epoxy resin, a halogenated bisphenol A novolac epoxy resin, a halogenated bisphenol F novolac epoxy resin, a halogenated alicyclic epoxy resin, a halogenated aliphatic linear epoxy resin, a halogenation product of a glycidyl ester epoxy resin, a halogenation product of a glycidylamine epoxy resin, a halogenation product of a hydantoin epoxy resin, a halogenation product of an isocyanurate epoxy resin, a glycidyl ether of a halogenated dihydric phenol, a glycidyl ether of a halogenated dihydric alcohol, a halogenated bisphenol A, a halogenated bisphenol F, a halogenation product of a polyvinylphenol, a halogenated phenol novolac resin, a halogenated cresol novolac resin, a halogenated alkylphenol novolac resin, a halogenated catechol novolac resin and a halogenated bisphenol F novolac resin.

5. The epoxy resin composition for a printed wiring board of claim 1, wherein the epoxy resin (a) is obtained by epoxidizing a condensation product of phenol with salicylaldehyde.

6. The epoxy resin composition for a printed wiring board of claim 1, wherein the condensation product (b) of bisphenol A with formaldehyde is a bisphenol A novolac resin.

7. The epoxy resin composition for a printed wiring board of claim 1, which contains 0.5 to 1.5 equivalents of phenolic hydroxyl groups of the condensation product (b) per equivalent of epoxy groups of the epoxy resin (a).

8. The epoxy resin composition for a printed wiring board of claim 1, wherein the flame retardant (c) is tetrabromobisphenol A.

9. The epoxy resin composition for a printed wiring board of claim 1, wherein the flame retardant (c) is a glycidyl ether of tetrabromobisphenol A.

10. The epoxy resin composition for a printed wiring board of claim 1, wherein the flame retardant (c) is a brominated product of a glycidyl ether of a condensation product of phenol with formaldehyde.

11. The epoxy resin composition for a printed wiring board of claim 1, wherein the curing accelerator (d) is an isocyanate-masked imidazole.

12. A laminate for a printed wiring board produced by impregnating a base material with a resin varnish containing the epoxy resin composition for a printed wiring board of claim 1 and drying to form prepreg, superposing at least two sheets of the prepreg upon each other, with a metal foil superposed on one or both sides of the superposed composite, and heating and pressing the superposed composite.

13. The epoxy resin composition for a printed wiring board of claim 1, which contains 30 to 200 parts by weight of the flame retardant (c) per 100 parts by weight of the epoxy resin (a).

14. The epoxy resin composition for a printed wiring board of claim 1, wherein the flame retardant (c) is a brominated bisphenol A epoxy resin.

15. The epoxy resin composition for a printed wiring board of claim 1, wherein the curing accelerator (d) is 1-cyanoethyl-2-ethyl-4-methylimidazole.

16. The epoxy resin composition for a printed wiring board of claim 1, wherein the imidazole has an imidazoline ring.

17. The epoxy resin composition for a printed wiring board of claim 1, wherein the curing accelerator is an imidazole having an imino group masked with acrylonitrile.

18. A process for manufacturing a laminate for a printed wiring board, comprising the steps of:
(a) impregnating a base material with a resin varnish containing the epoxy resin composition for a printed wiring board of claim 1, and drying to form prepreg material;
(b) superposing at least two sheets of the prepreg material upon each other, with a metal foil superposed on one or both sides of the superposed composite; and
(c) heating and pressing the superposed composite.

* * * * *